(12) United States Patent
Kong et al.

(10) Patent No.: US 7,620,923 B1
(45) Date of Patent: Nov. 17, 2009

(54) RUN-TIME EFFICIENT METHODS FOR ROUTING LARGE MULTI-FANOUT NETS

(75) Inventors: Raymond Kong, San Francisco, CA (US); Anirban Rahut, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/050,452

(22) Filed: Mar. 18, 2008

Related U.S. Application Data

(62) Division of application No. 11/119,012, filed on Apr. 29, 2005, now Pat. No. 7,376,926.

(51) Int. Cl.
*G06F 17/50* (2006.01)

(52) U.S. Cl. .............................. 716/12; 716/13; 716/14

(58) Field of Classification Search .............. 716/12–14
See application file for complete search history.

(56) References Cited

U.S. PATENT DOCUMENTS

| | | | |
|---|---|---|---|
| 4,831,725 A | 5/1989 | Dunham et al. | |
| 6,247,167 B1 | 6/2001 | Raspopovic et al. | |
| 7,080,342 B2* | 7/2006 | Teig et al. ..................... | 716/14 |
| 7,089,524 B1 | 8/2006 | Teig et al. | |
| 7,171,635 B2* | 1/2007 | Teig et al. ..................... | 716/3 |
| 7,398,498 B2* | 7/2008 | Teig et al. ..................... | 716/12 |
| 2001/0018759 A1* | 8/2001 | Andreev et al. ................ | 716/7 |
| 2003/0005155 A1* | 1/2003 | Carbonell et al. ............ | 709/239 |
| 2003/0063614 A1* | 4/2003 | Teig et al. ..................... | 370/401 |
| 2003/0074645 A1 | 4/2003 | Clabes et al. | |
| 2004/0117753 A1* | 6/2004 | Kahng et al. .................. | 716/12 |
| 2004/0216072 A1* | 10/2004 | Alpert et al. .................. | 716/13 |
| 2005/0166164 A1 | 7/2005 | Ren et al. | |
| 2005/0229137 A1* | 10/2005 | Ito ............................... | 716/12 |

OTHER PUBLICATIONS

Hu et al., "A Survey on Multi-net Global Routing for Integrated Circuits"; 2001; Integration, the VLSI Journal; pp. 1-49.*
Sapatnekar et al., " A Timing-Constrained Simultaneous Global Routing Algoritm", IEEE Transactions on Computer-Aided Design of Integrated Circuits and Systems, vol. 21, No. 9, Sep. 2002, pp. 1025-1036.*

(Continued)

*Primary Examiner*—Jack Chiang
*Assistant Examiner*—Suresh Memula
(74) *Attorney, Agent, or Firm*—Kevin T. Cuenot

(57) ABSTRACT

A method of limiting the routing resources of an integrated circuit (IC) that are available for use when routing multi-fanout nets can include selecting a multi-fanout net comprising a source and a plurality of loads and identifying each region of the IC which does not include at least one of the plurality of loads. Each of the regions can have a defined geometry. A type of routing resource can be selected which has a physical orientation with respect to the IC that corresponds to the geometry of the regions of the IC. Each routing resource of the selected type that is located within a region of the IC which does not include at least one of the plurality of loads can be excluded from consideration when routing the multi-fanout net.

4 Claims, 5 Drawing Sheets

OTHER PUBLICATIONS

Spruth et al., "Parallel Routing of VLSI Circuits Based on Net Independency", IEEE, 1994, pp. 949-953.*

Chiang et al., "Global Routing Based on Steiner Min-Max Trees", IEEE Transactions on Computer-Aided Design, vol. 9, No. 12, Dec. 1990, pp. 1318-1325.*

Cheng et al.; "RISA: Accurate and Efficient Placement Routability Modeling"; 1994; ACM, Cadence Design Systems; pp. 1-6.*

Betz et al.; "VPR: A New Pakcing, Placement and Routing Tool for FPGA Research"; 1997; International Workshop on Field Programmable Logic and Applications, Department of Electrical and Computer Engineering, University of Toronto; pp. 1-10.*

U.S. Appl. No. 11/119,012, filed Apr. 29, 2005, Kong et al.

U.S. Appl. No. 12/050,447, filed Mar. 18, 2008, Kong et al.

Betz, Vaughn et al., "VPR: A New Packing, Placement and Routing Tool for FPGA Research," 7th International Workshop on Field Programmable Logic and Applications (FPL'97), Sep. 1-2, 1997, pp. 1-10, London, UK.

Lee, C.Y., "An Algorithm for Path Connections and its Applications," *IRE Transactions on Electronic Computers*, Sep. 1961, pp. 346-365, vol. EC-10, No. 3.

McMurchie, Larry et al., "PathFinder: A Negotiation-Based Performance-Driven Router for FPGAs," Proceeding of the $3^{rd}$ International ACM Symposium on Field-Programmable Gate Arrays (FPGA'95), Feb. 12-14, 1995, pp. 111-117, Monterey, California, USA.

Preas, Bryan T. et al., "Physical Design Automation of VLSI Systems," copyright 1988, pp. 163-165, The Benjamin/Cummings Publishing Co, Inc., San Francisco, California, USA.

Xilinx, Inc., "Virtex-II Platform FPGA Handbook," Dec. 2000, pp. 33-75, Xilinx, Inc., 2100 Logic Drive, San Jose, California 95124, USA.

* cited by examiner

RUN-TIME EFFICIENT METHODS FOR ROUTING LARGE MULTI-FANOUT NETS

FIELD OF THE INVENTION

This invention relates to the field of electronic circuit design and, more particularly, to routing multi-fanout nets of integrated circuits.

BACKGROUND OF THE INVENTION

Modern circuits typically are designed using some form of computer aided design (CAD) tool. Using a CAD tool, a software representation of a circuit design can be generated. This software representation, often referred to as a netlist, specifies the logic and logical connectivity, i.e. nets, of the circuit design. Software-based place and route tools are responsible for assigning, or placing, instances of the various circuit structures to physical locations on an integrated circuit (IC). Routing refers to the process of determining physical implementations of the nets that achieve the specified logical connectivity.

Traditional routing techniques have routed multi-fanout nets one load at a time. A multi-fanout net is a net that has more than one load. Modern ICs include very large multi-fanout nets, having many loads. In the conventional approach, each load of a multi-fanout net is routed independently of the others, one after the other sequentially. A minimum cost solution is found for each load. Each routing solution for a given source-load signal path is provided by a routing expansion. In using this approach, the number of routing expansions required to route a single multi-fanout net generally is proportional to the number of loads of the multi-fanout net.

Typically, a breadth-first search algorithm is used to process an underlying graph representation of the circuit design to determine a routing for each source-load signal path of a multi-fanout net. The graph representation can be that of a grid which represents the routing fabric of a device. Within the grid model, the entire routing surface is represented as a rectangular array of cells or nodes.

Routing each load of a multi-fanout net individually does have disadvantages. One such disadvantage is that a significant amount of run-time is needed to route a multi-fanout net. In general, the runtime required to route a multi-fanout net increases with the complexity of the net topology. Accordingly, as circuit designs and ICs become more complex, the time required to route the devices, particularly with respect to multi-fanout nets, also increases.

Another disadvantage is that the quality of a route for a given multi-fanout net often varies according to the order in which the loads of the multi-fanout net are routed. As each load is routed, the routing resources that are available for routing as yet unrouted loads of the multi-fanout net are decreased. Decreasing the pool of available routing resources means that fewer routing solutions can be determined from the pool. With respect to an overall circuit design, routing each load of a given multi-fanout net individually can produce a situation in which the resulting route is locally optimal, but not globally optimal.

Further, because the order in which loads of a multi-fanout net is routed can vary, routing symmetry is not maintained. This means that the routes for the different signal paths of a multi-fanout net can vary significantly with respect to one another. As a result, each signal path may have a very different signal propagation delay, thereby causing delay skew issues in the circuit design.

So called single expansion routers address some of the limitations of conventional routers, particularly in relation to routing multi-fanout nets. A single expansion router can route each signal path of a multi-fanout net in a single routing expansion. Single expansion routers treat all loads of the multi-fanout net as a single problem. During a single routing expansion, the router begins with the source and locates as many loads as possible. Rather than terminating when a first load is located, the routing expansion continues until a programmable interconnection point (PIP) limit is reached or until all loads of the multi-fanout net have been found. An example of a single expansion router is described in *VPR: A New Packing, Placement, and Routing Tool for FPGA Research*, 1997 International Workshop on Field Programmable Logic and Applications, Vaughn Betz, et al. (1997).

By routing a multi-fanout net in a single expansion, the complexity of the route problem is no longer dependent upon the number of loads of the net. Instead, complexity is dependent upon the predetermined PIP limit that is set and the routing architecture of the IC. Accordingly, when routing a multi-fanout net that is geographically large, the PIP limit must be set to a value that is large enough to ensure that the router locates most, if not all, of the loads.

Single expansion routers, however, also have disadvantages. In particular, when large PIP limits are established, the run-time performance of single expansion routers tends to degrade rapidly. Though high PIP limits are needed when routing large nets, high PIP limits can lead to a situation in which the router visits most, if not all, routing resources of the IC during an expansion. For larger ICs, the run-time performance of a single expansion router generally becomes dependent upon the number of nodes in the IC. As such, the run-time performance of a single expansion router tends to scale poorly as the size of an IC increases.

It would be beneficial to limit the number of routing resources that are explored for routing a multi-fanout net, thereby decreasing the run-time of a router.

SUMMARY OF THE INVENTION

The present invention provides methods relating to reducing the field of routing resources that can be used to route multi-fanout nets in integrated circuits (ICs). One embodiment of the present invention can include a method of limiting the routing resources of an IC which are available for use when routing multi-fanout nets. The method can include selecting a multi-fanout net comprising a source and a plurality of loads and identifying each region of the IC which does not include at least one of the plurality of loads. Each region can have a defined geometry. A type of routing resource can be selected which has a physical orientation with respect to the IC which corresponds to the geometry of the regions of the IC. Each routing resource of the selected type that is located within a region of the IC which does not include at least one of the plurality of loads can be excluded from consideration when routing the multi-fanout net.

In one embodiment, the defined geometry can be a column. In that case, the selected type of routing resource can be a vertical routing resource. In another embodiment, the defined geometry can be a row and the selected type of routing resource can be a horizontal routing resource.

The method further can include excluding from consideration one or more routing resources that do not conform with a routing template associated with the multi-fanout net. The routing template can specify a sequence of routing resource types to be used when routing a signal path. The type of the routing resource can indicate a length of the routing resource. Further, the selected type of routing resource can have a minimum length.

Another embodiment of the present invention can include a method of limiting the routing resources of an IC that are available to route a multi-fanout net. The method can include determining regions of the IC which include at least one load of the multi-fanout net and defining a collection of routing resources from the regions of the IC that include at least one load of the multi-fanout net. Each routing resource of the collection can be of a same type. Additional routing resources having a same type as those within the collection can be included in the collection as well. The additional routing resources can be from one or more neighboring regions of the IC.

Each routing resource of the IC that is of the same type as the routing resources in the collection and which also is not included in the collection can be disqualified. A router can be constrained to consider only routing resources that have not been disqualified when routing the multi-fanout net.

The method further can include disqualifying each routing resource that is located at least a minimum distance from a source of the multi-fanout net. At least one routing resource of the IC that does not conform to a routing template associated with the multi-fanout net also can be disqualified.

The regions of the IC can have a defined geometry. Accordingly, the type of routing resource in the collection can have a physical orientation with respect to the IC that conforms to the geometry of the regions of the IC. In one embodiment, the defined geometry of each region can be rectangular. In that case, the type of routing resource of the collection can have a physical orientation that is substantially parallel to a longest edge of the regions. More particularly, the defined geometry can be a column and the physical orientation can be vertical. Alternatively, the defined geometry can be a row and the physical orientation can be horizontal.

Another embodiment of the present invention can include a method of determining which routing resources of an IC are available for use in routing a multi-fanout net. The method can include defining a bounding perimeter encompassing the multi-fanout net, identifying routing resources within the bounding perimeter, and qualifying routing resources within the bounding perimeter which conform to a routing template. A router then can be constrained to consider only qualified routing resources when performing a routing expansion for the multi-fanout net.

The bounding perimeter can be rectangular in shape. In that case, one or more sides of the bounding perimeter can be expanded. If the IC is subdivided into regions having defined geometries, the method can include identifying each region that does not include at least one load of the multi-fanout net. Within portions of each identified region within the bounding perimeter, each routing resource having a minimum length and having a physical orientation that corresponds to the geometry of the region within which the routing resource is disposed can be disqualified.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION

The present invention provides a solution for reducing the number of routing resources, or nodes, that must be visited when routing large multi-fanout nets. The embodiments disclosed herein can be used with single expansion routers and, more particularly, with template routing expansions. In one embodiment of the present invention, a bounding technique is used as a pruning strategy to define the routing resources that are available for use in routing a given multi-fanout net. In another embodiment, the locations of loads of the multi-fanout net can be used to determine which routing resources will be available.

For purposes of illustration, aspects of the present invention will be described largely with reference to programmable logic devices (PLDs), such as field programmable gate arrays (FPGAs). It should be appreciated, however, that the techniques disclosed herein can be applied to any of a variety of different types of IC, for example Application Specific Integrated Circuits (ASICs), gate arrays, and standard cell-based devices.

Figure 1:
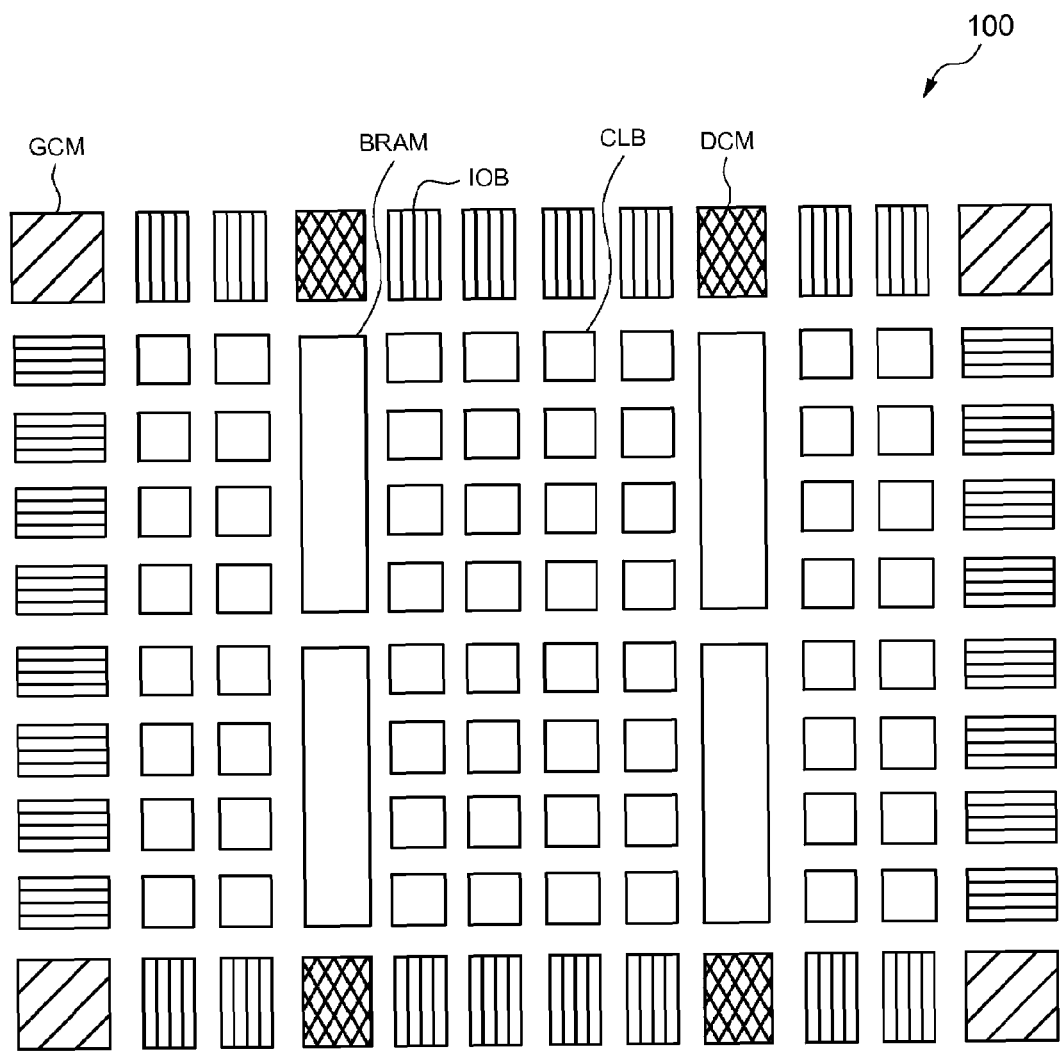
FIG. 1 is a block diagram illustrating the Virtex-II FPGA architecture.

FIG. 1 is a block diagram illustrating the Virtex-II FPGA architecture. Advanced FPGAs can include several different types of programmable logic blocks in the array. For example, FIG. 1 illustrates a Xilinx Virtex-II FPGA 100 that includes blocks of Random Access Memory (RAM) and blocks implementing multiplier functions. The Xilinx Virtex-II FPGA is described in detail in pages 33-75 of the "Virtex-II Platform FPGA Handbook", published December, 2000, available from Xilinx, Inc., 2100 Logic Drive, San Jose, Calif. 95124, which pages are incorporated herein by reference.

The Virtex-II FPGA includes, in addition to configurable logic blocks (CLBs) and input/output blocks (IOBs), blocks of random access memory (BRAM), global clock manager circuits (GCM), and digital clock manager circuits (DCMs). Note that the block RAM circuits differ from the configuration memory cells in that the block RAM is used to store user data, while the configuration memory cells (not shown) are used to control the functionality of the user design loaded into the FPGA.

FIG. 1 is provided as an illustration of the architecture of an FPGA. As shown, the FPGA, in general, has a structure where elements such as CLBs are arranged in columns and rows. Though the Virtex-II FPGA has been used to illustrate high level aspects of FPGAs, the present invention is not intended to be limited to use with any particular type or architecture of FPGA, or PLD for that matter. It should be appreciated that other devices, whether in whole or in part, can have a similar architecture. As such, the embodiments described herein can be applied to these devices as well.

Figure 2:
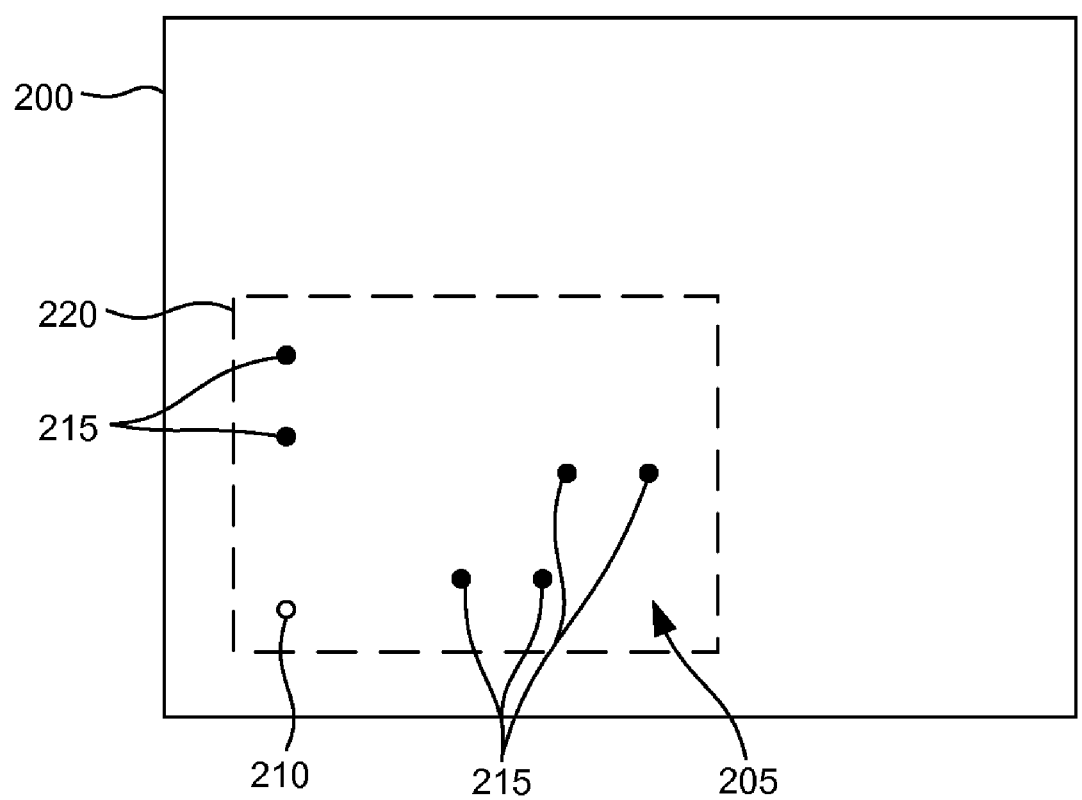
FIG. 2 is a schematic diagram of an integrated circuit (IC) which illustrates a technique for reducing the number of routing resources that are available to route a multi-fanout net in accordance with one embodiment of the present invention.

FIG. 2 is a schematic diagram of an IC 200 which illustrates a technique for reducing the number of routing resources that are available to route a multi-fanout net in accordance with one embodiment of the present invention. As noted, IC 200 can be any of a variety of different IC types including, but not limited to, a PLD, such as an FPGA, or an IC built or designed using standard cell technology. In the case of an FPGA, IC 200 can include a plurality of CLBs arranged in grid form such that the CLBs are ordered in rows and columns. The CLBs can be interconnected through a routing matrix having switches, referred to as programmable interconnect points (PIPs), located at intersections of vertical and horizontal routing resources, i.e. wires.

The circuit design to be implemented in IC 200 can specify a plurality of multi-fanout nets. For purposes of illustration, however, only one multi-fanout net 205 is illustrated. The multi-fanout net 205 includes a source 210 and a plurality of loads 215. Though not shown, it should be appreciated that the source 210 and loads 215 can be located in a same CLB or in one or more different CLBs.

In accordance with one embodiment of the present invention, a bounding perimeter 220 has been created which encompasses the source 210 and each load 215 of multi-fanout net 205. The bounding perimeter 220 can be defined in such as way as to be only large enough to encompass the source and all loads of net 205. While the bounding perimeter 220 can be configured as any of a variety of different shapes, in one embodiment, the bounding perimeter 220 can be rectangular in shape.

Once defined, the bounding perimeter 220 can be used to eliminate routing resources from consideration when routing multi-fanout net 205. In other words, bounding perimeter 220 can be used to determine which routing resources of the IC 200 are qualified for use in routing multi-fanout net 205. Those routing resources that are located within the region defined by the bounding perimeter 220 can be considered qualified for use in routing multi-fanout net 205. Those routing resources that are located outside of the region defined by the bounding perimeter 220 can be considered unusable for purposes of routing multi-fanout net 205.

IC routing topologies, or routing fabrics, differ from one device to another. With respect to the Virtex family of FPGA devices, available from Xilinx, Inc., the routing resources are hierarchical in nature. Generally, the routing resource type provides an indication of the length of the wire and/or the direction in which the wire runs, i.e. horizontal or vertical. One type of routing resource, referred to as a double wire, can span two CLBs. Thus, if a horizontal double wire is located in the leftmost column of the bounding perimeter 220, that double wire could span two additional columns to the left. Other devices may have other types of idiosyncrasies or deviations with respect to the routing fabric that should be taken into account by adjusting the size of the bounding perimeter.

With this in mind, the bounding perimeter 220 optionally can be enlarged beyond the minimal size needed to encompass the source 210 and all loads 215 of net 205. This helps to ensure that sufficient routing resources will be included within the defined region and be available for routing multi-fanout net 205. In one embodiment, the bounding perimeter 220 can be enlarged by increasing the area of the defined region by a predetermined percentage. In another embodiment, the bounding perimeter 220 can be enlarged by relocating one or more, or all, of the walls of the bounding perimeter 220 outward. Referring to the case of a double wire in the leftmost column of the bounding perimeter 220, the leftmost wall of the bounding perimeter 220 can be moved two columns to the left. This ensures that a double wire would be included within the bounding perimeter 220 and therefore be considered for the routing solution.

Figure 3:
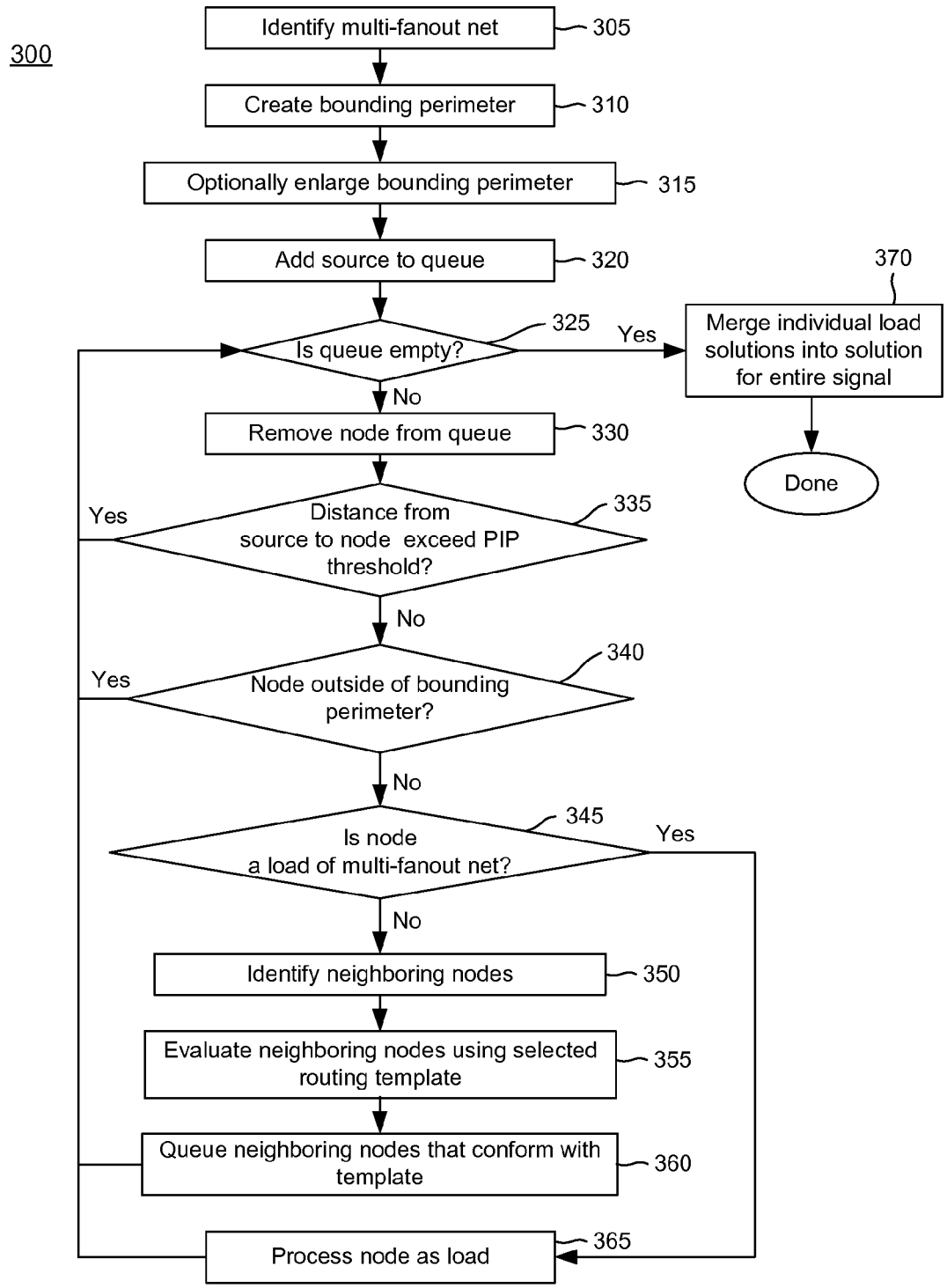
FIG. 3 is a flow chart illustrating a method of reducing the number of routing resources that can be considered when routing a multi-fanout net of an IC in accordance with the embodiment of FIG. 2.

FIG. 3 is a flow chart illustrating a method 300 of reducing the number of routing resources that can be considered when routing a multi-fanout net of an IC in accordance with the embodiment the FIG. 2. The method 300 can begin in a state where a circuit design, such as a netlist or other software-based circuit representation, has been loaded into a software-based design tool capable of performing place and route functions. Further, the circuit design will have been placed by the placer. The design tool can be configured to perform template routing, which routes multi-fanout nets in a single routing expansion. In one embodiment, the software tool can be implemented as the Xilinx Integrated Software Environment (ISE) 7.1i. ISE 7.1i is a computer aided design package available from Xilinx, Inc. In any case, the design tool can be configured to perform the various steps disclosed herein.

Template routing utilizes a pre-defined pattern or sequence of wire types for routing each source-load signal path of a multi-fanout net during a single expansion. In relation to the Virtex family of FPGA devices, for example, available wire types include long wires which span across the entire IC, hex wires which span six tiles, and double wires which span two neighboring tiles. Template routing enforces a template or hierarchy of routing resource types when routing a signal path. An illustration of a routing template can specify that long wires source hex wires, hex wires source double wires, etc. Another example of a routing template can be {horizontal long, horizontal full hex, vertical long, vertical full hex, pin}. Thus, for any given signal path, the wires used to route the signal path from source to load must conform to the routing template in terms of the type of wires used and the sequence of such wire types. Accordingly, the routing template serves to limit the available routing resources for any given signal path.

Beginning in step 305, a multi-fanout net can be identified using the design tool. In step 310, a bounding perimeter can be created which encompasses the source and each load of the multi-fanout net. Though the bounding perimeter can be any of a variety of different shapes, in one embodiment, the bounding perimeter can be rectangular in shape. In step 315, the bounding perimeter optionally can be enlarged by a predetermined percentage or by expanding one or more of the boundary walls of the bounding perimeter outward by one or more columns or rows as the case may be. As noted, expanding the bounding perimeter helps to accommodate any idiosyncrasies or special attributes relating to the routing fabric of a device.

As noted, if a grid model is used to represent the routing fabric of a device, the entire routing surface can be represented as a rectangular array of cells or nodes. Thus, in step 320, a node representing the source of the multi-fanout net can be added to a queue used to manage the routing expansion. The queue can be configured as a first-in-first-out (FIFO) queue. In step 325, a determination can be made as to whether the queue is empty. If so, the method can continue to step 370 and then end as no further nodes are required to be visited during a routing expansion. The routing for the multi-fanout net is complete. If not, however, the method can proceed to step 330, where the node that has been in the queue the longest period of time is removed, or de-queued, for processing.

Accordingly, in step 335, a determination can be made as to whether the de-queued node is located outside of the region defined by the bounding perimeter. If so, the node is not to be used for routing the multi-fanout net. In that case, the method can proceed to step 325 to process further nodes in the queue as may be required. If the node is located within the region defined by the bounding perimeter, the method can proceed to step 340.

In step 340, a determination can be made as to whether the distance between the de-queued node and the source of the multi-fanout net exceeds a threshold PIP value. The threshold PIP value serves to limit the complexity of the routing operation in the context of a single expansion routing. Setting a sufficiently high PIP threshold ensures that the router locates most, if not all, of the loads. If the distance, as measured in PIPs encountered between the source and the de-queued node, exceeds the PIP threshold, the method can proceed to step 325 to process further nodes from the queue until such time that none remain. If the distance does not exceed the PIP threshold, the method can proceed to step 345.

In step 345, a determination can be made as to whether the de-queued node represents a load of the multi-fanout net. If so, the method can proceed to step 365, where the de-queued node can be processed as a load node. When an explored node is identified as a load of the signal, i.e. a target, the router stores the list of nodes from the source node within a data structure as a solution to be used for future processing. Typically, this entails maintaining and/or updating the detailed routing solution, i.e. the PIPs between the source and the current load. If the de-queued node is not a load node, the method can proceed to step 350, where the neighboring nodes of the de-queued node can be identified. The neighboring nodes can be those eight nodes that surround the de-queued node when viewed as a gridded graph, i.e. the node above, below, to the left, to the right, and in each of the four corners of the de-queued node.

In step 355, the neighboring nodes can be evaluated in terms of a selected routing template. As the routing template specifies sequences of permissible routing resource types that can be used to route a given signal, each neighboring node is evaluated to determine whether the node conforms with the routing template. Each of the neighboring nodes of the de-queued node can be evaluated to determine whether the neighboring node represents one of the enumerated routing resources of the routing template. Each neighboring node further can be evaluated to determine whether it can connect to another routing resource in the manner or sequence specified by the routing template.

In step 360, each of the neighboring nodes of the selected node that conforms with the template can be queued. The method then can loop back to step 325 to process further nodes from the queue. If no further nodes remain in the queue, the method can proceed to step 370. In step 370, when the queue is empty, the router processes the solutions associated with the various load pins and merges the individual solutions into a single solution for the whole signal. Step 370 is performed when the PIP threshold is reached or when all loads have been identified. After step 370, the method can end.

Figure 4:
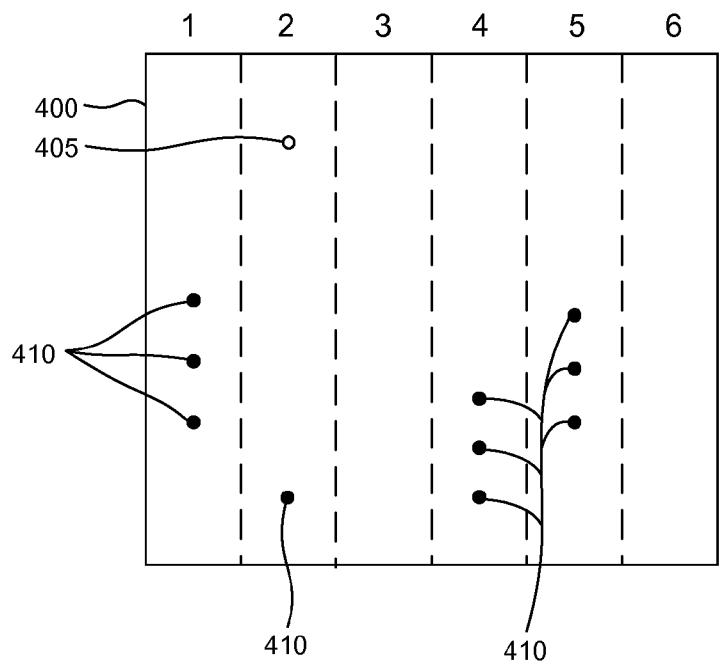
FIG. 4 is a schematic diagram of an IC which illustrates a technique for reducing the number of routing resources that can be used for routing a multi-fanout net in accordance with another embodiment of the present invention.

FIG. 4 is a schematic diagram of an IC 400 which illustrates a technique for reducing the number of routing resources that can be used for routing a multi-fanout net in accordance with another embodiment of the present invention. For purposes of illustration, IC 400 has been subdivided into six regions. Each region has a defined geometry. In this case, each region corresponds to a rectangular column. In the case of an FPGA, each column can correspond to a column of CLBs. It should be appreciated, that while six columns are illustrated, IC 400 can include a larger number of columns depending upon the size and complexity of the device.

A source 405 and multiple loads 410 of a multi-fanout net are shown in various locations of IC 400. The source 405 is located within column 2. Each column of the IC 400 includes a load 410 of the multi-fanout net, with the exception of columns 3 and 6. In accordance with one embodiment of the present invention, particular types of routing resources, i.e. wires, located within regions of IC 400 which do not include loads of the multi-fanout net can be excluded from consideration when routing the net. From a review of FIG. 4, it can be seen that, in general, vertical routing resources located in columns 3 and 6 are unlikely to reach a load of the multi-fanout net. This can be particularly true with respect to longer, vertical routing resources within columns 3 and 6. Since longer routing resources have the potential to connect with more routing resources than shorter ones, excluding a longer routing resource from consideration likely narrows the field of available routing resources for routing a given net more so than excluding a shorter routing resource.

In accordance with one embodiment of the present invention, routing resources that have a physical orientation which corresponds to the geometry of the regions of IC 400, and which are located in regions of IC 400 that do not contain a load of the multi-fanout net, can be disqualified from use when routing the multi-fanout net. With reference to FIG. 4, vertical routing resources can be said to have a physical orientation that corresponds to the geometry of the regions, in this case columns. Accordingly, vertical routing resources located in columns 3 and 6 can be excluded from consideration when routing the multi-fanout net.

In another embodiment, the type of vertical routing resources that are excluded can be selected according to the length of such resources. Routing resources, or types of routing resources, having a minimum length can be excluded. By excluding longer, vertical routing resources from columns 3 and 6, the number of nodes that must be visited during an expansion can be significantly reduced, thereby leading to a reduction in the run-time of the router for routing the multi-fanout net.

Figure 5:
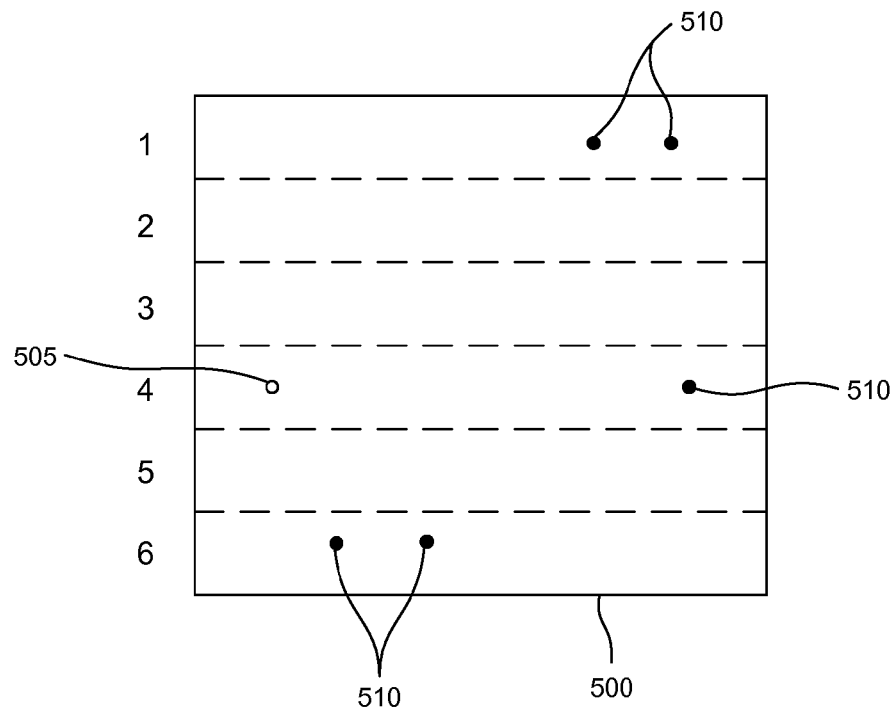
FIG. 5 is a schematic diagram of an IC which illustrates a technique for reducing the number of routing resources that can be used for routing a multi-fanout net in accordance with yet another embodiment of the present invention.

FIG. 5 is a schematic diagram of an IC 500 which illustrates a technique for reducing the number of routing resources that can be used for routing a multi-fanout net in accordance with yet another embodiment of the present invention. FIG. 5 illustrates an embodiment where the regions of the IC have been defined as rectangular rows instead of columns. Each row can be representative of a row of CLBs in the case of an FPGA.

A source 505 and a plurality of loads 510 of a multi-fanout net are shown. Source 505 is located in row 4 and loads 510 are located in rows 1, 4, and 6. In this case, horizontal routing resources can be said to have a physical orientation that corresponds to the geometry of the regions. Accordingly, horizontal routing resources located in rows 2, 3, and 5, can be excluded as no loads 510 of the multi-fanout net exist within these rows. As was the case with reference to FIG. 4, the horizontal routing resources that can be excluded further can have a minimum length, or be of a type of routing resource having a minimum length.

Figure 6:
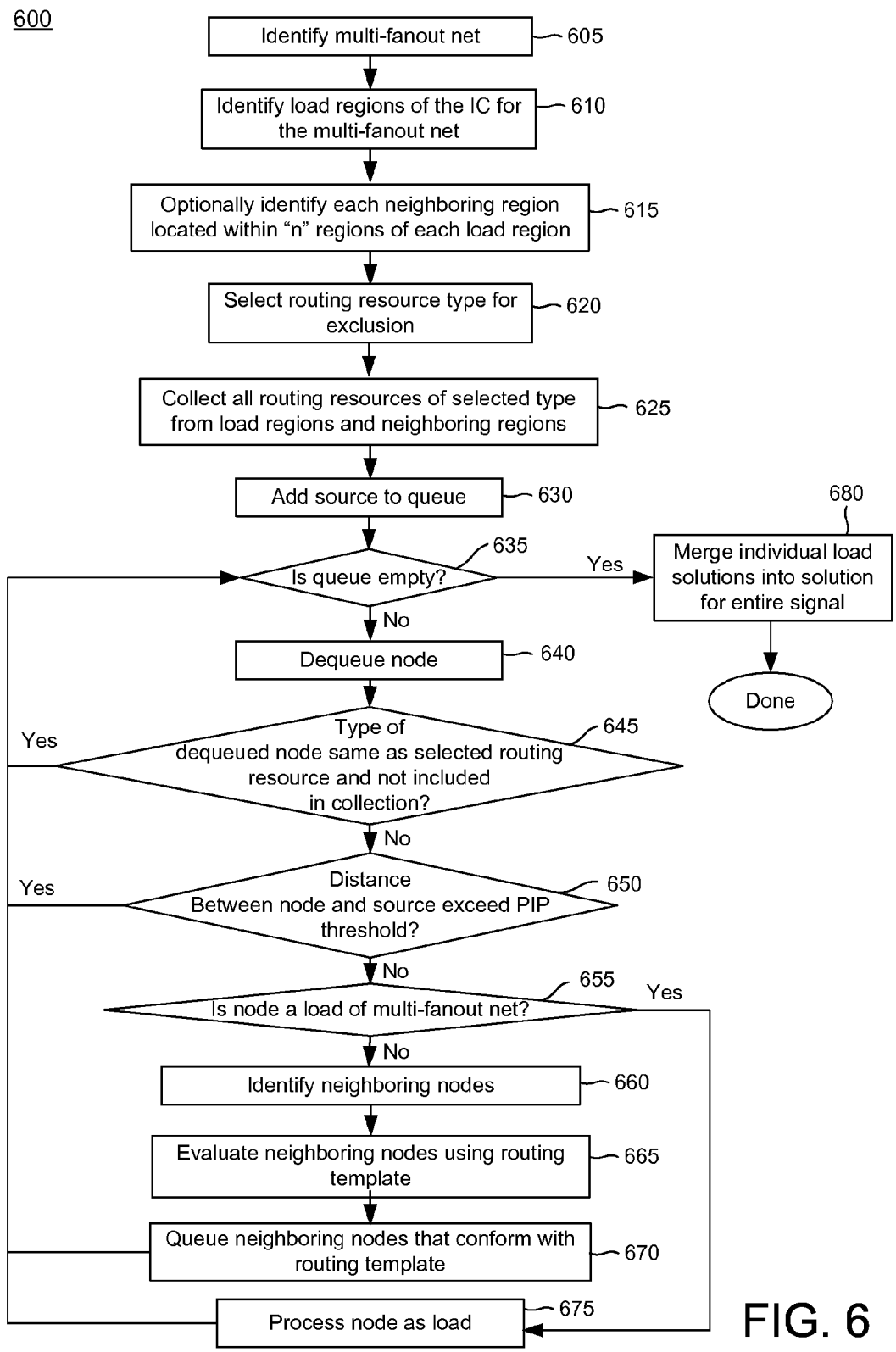
FIG. 6 is a flow chart illustrating a method of reducing the number of routing resources that can be considered when routing a multi-fanout net of an IC in accordance with the inventive arrangements disclosed herein.

FIG. 6 is a flow chart illustrating a method 600 of reducing the number of routing resources that can be considered when routing a multi-fanout net of an IC in accordance with the inventive arrangements disclosed herein. The method 600 can begin in a state where a circuit design has been loaded into a software-based design tool capable of performing place and route functions. The design tool, for example the Xilinx ISE 7.1, can be configured to perform template-style routing and the various steps described herein.

Once the circuit design is loaded, in step 605 a multi-fanout net can be identified. In step 610, each region of the IC that includes a load of the multi-fanout net, referred to as a load region, can be identified. By identifying load regions, those regions of the IC which do not include loads of the multi-fanout net also are identified. In step 615, each region that is within "n" regions of each load region optionally can be identified. These regions can be referred to as neighboring regions. If, for example, regions correspond to columns and n=2, then each column that is within 2 columns to the left or right of a load column can be identified as a neighboring region. A similar process can be undertaken when the regions are shaped as rows. Step 615 is intended to accommodate idiosyncrasies of an IC routing fabric as described herein, such as when a particular type of routing resource is able to link nodes that are more than one region to the right, left, up, or down as the case may be.

In step 620, a particular routing resource type can be selected for exclusion. Some routing resources, or wires, of the selected type will be unavailable for routing the multi-fanout net. In one embodiment, the type of routing resource selected can have a minimum length. Further, the type can correspond to the geometry of the regions of the IC. In illustration, if regions are columns, vertical routing resource types having a minimum length can be selected. If regions are rows, horizontal routing resource types having a minimum length can be selected.

In step 625, all routing resources of the selected type from the load regions and the neighboring regions can be collected, or grouped, into a collection of routing resources. Thus, each routing resource in the collection is of the selected routing resource type. In step 630, a node representing the source of the multi-fanout net can be added to a queue that is used to manage the routing expansion of the multi-fanout net. The queue can be configured as a first-in-first-out (FIFO) type of queue.

In step 635, a determination can be made as to whether the queue is empty. If so, the multi-fanout net has been routed. The method can proceed to step 680 and then end. If not, the method can proceed to step 640. In step 640, the node that has been in the queue the longest period of time can be de-queued, or removed, for processing. In step 645, a two-fold determination can be made. If the de-queued node represents a routing resource having a type that is equivalent to the selected routing resource type, and the de-queued node is not included in the collection of routing resources, the method can loop back to step 635 to process further nodes. Otherwise, the method can proceed to step 650.

In step 650, a determination can be made as to whether the distance of the de-queued node to the source exceeds a PIP threshold. If so, the method, again, can loop back to step 635 to process further nodes. If not, the method can continue to step 655. In step 655, an evaluation of whether the node represents a load of the multi-fanout net is performed. If the node represents a load, the method can continue to step 675 to process the node as a load. If not, the method proceeds to step 660.

In step 660, the neighboring nodes of the de-queued node can be identified. As noted, the neighboring nodes can be those nodes which are next to the de-queued node when the routing resources are viewed as a gridded representation. In step 665, the neighboring nodes can be evaluated to determine whether each conforms to a routing template. In step 670, each neighboring node of the de-queued node that conforms with the routing template can be added to the queue. After step 670, the method can loop back to step 635 to continue processing further nodes as may be required.

When the queue is empty, the method proceeds to step 680 where the router processes the solutions associated with the various load pins and merges the individual solutions into a single solution for the whole signal. Step 680 is performed when the PIP threshold is reached or when all loads have been identified. After step 680, the method can end.

In accordance with the inventive arrangements disclosed herein, the solution space that is available for use by a single expansion router for routing a multi-fanout net can be limited. This serves to decrease the runtime of a template router when routing a multi-fanout net. In one embodiment of the present invention, the solution space is limited by pruning, or disqualifying, routing resources from consideration through the use of a bounding perimeter. In another embodiment, routing resources are limited according to the location of loads of the multi-fanout net being routed. The present invention utilizes routing templates to accommodate varying net topologies and, further, accommodates IC structure by excluding routing resources that are unlikely to lead to a routing solution.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program, software, application, or any variant thereof, in the present context, means any expression, in any language, code or notation, of a set of instructions intended to cause a system having an information processing capability to perform a particular function either directly or after either or both of the following: a) conversion to another language, code, or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of determining which routing resources of an integrated circuit (IC) are available for use in routing a multi-fanout net, said method comprising:

defining a bounding perimeter encompassing the multi-fanout net, wherein the bounding perimeter is sized according to, and comprises, locations of a source and each of a plurality of loads of the multi-fanout net;

identifying routing resources within the bounding perimeter and a type for each identified routing resource, wherein type specifies length and orientation of the routing resource;

qualifying routing resources within the bounding perimeter which conform to a routing template, wherein the routing template specifies a permissible sequence of routing resource types that must be used to route a signal path; and constraining a router to consider only qualified routing resources when performing a routing expansion for the multi-fanout net.

2. The method of claim 1, wherein the bounding perimeter is rectangular in shape.

3. The method of claim 2, further comprising expanding at least one side of the bounding perimeter to encompass a routing resource that, prior to expansion of the bounding perimeter, extended beyond the bounding perimeter.

4. A method of determining which routing resources of an integrated circuit (IC) are available for use in routing a multi-fanout net, wherein the IC is subdivided into regions having defined geometries, said method comprising:

defining a bounding perimeter encompassing the multi-fanout net, wherein the bounding perimeter is sized according to locations of a source and each of a plurality of loads of the multi-fanout net;

identifying routing resources within the bounding perimeter and a type for each identified routing resource, wherein type specifies length and orientation of the routing resource;

qualifying routing resources within the bounding perimeter which conform to a routing template, wherein the routing template specifies a permissible sequence of routing resource types that must be used to route a signal path;

constraining a router to consider only qualified routing resources when performing a routing expansion for the multi-fanout net;

identifying each region of the IC that does not include at least one load of the multi-fanout net; and prior to routing the multi-fanout net, within a portion of each identified region that is located within the bounding perimeter, disqualifying each routing resource having a minimum length and having a physical orientation that is parallel to a longest edge of the region within which the routing resource is disposed from being used in routing the multi-fanout net.

\* \* \* \* \*